(12) United States Patent
Park et al.

(10) Patent No.: US 7,441,591 B2
(45) Date of Patent: Oct. 28, 2008

(54) HEATSINK

(75) Inventors: Hee-sung Park, Suwon-si (KR); Sun-soo Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 170 days.

(21) Appl. No.: 11/520,012

(22) Filed: Sep. 13, 2006

(65) Prior Publication Data

US 2007/0068652 A1  Mar. 29, 2007

(30) Foreign Application Priority Data

Sep. 29, 2005 (KR) .................. 10-2005-0091197

(51) Int. Cl.
*F28F 7/00* (2006.01)
*F28F 13/08* (2006.01)
*H05K 7/20* (2006.01)

(52) U.S. Cl. ............ 165/80.4; 165/80.3; 165/147

(58) Field of Classification Search ........... 165/121, 165/122, 80.3, 104.34, 146, 147, 80.4; 361/688–697, 361/704, 707, 715; 454/184
See application file for complete search history.

(56) References Cited

U.S. PATENT DOCUMENTS

| | | | |
|---|---|---|---|
| 5,099,311 A | | 3/1992 | Bonde et al. |
| 5,304,846 A * | 4/1994 | Azar et al. ............... 257/722 |
| 5,597,035 A * | 1/1997 | Smith et al. ............. 165/80.3 |
| 5,630,469 A * | 5/1997 | Butterbaugh et al. ..... 165/80.3 |
| 5,810,072 A * | 9/1998 | Rees et al. ............... 165/80.3 |
| 5,936,836 A * | 8/1999 | Scholder .................... 361/695 |
| 6,587,743 B1 * | 7/2003 | White et al. .............. 700/121 |
| 6,940,716 B1 * | 9/2005 | Korinsky et al. ......... 361/695 |
| 7,113,399 B2 * | 9/2006 | Hisano et al. ............. 361/688 |

FOREIGN PATENT DOCUMENTS

| | | |
|---|---|---|
| JP | 62-286657 | 12/1987 |
| KR | 2004-52331 | 6/2004 |
| KR | 2004-53551 | 6/2004 |

OTHER PUBLICATIONS

Office Action issued in Korean Patent Application No. 2005-91197 on Oct. 25, 2006.

* cited by examiner

*Primary Examiner*—Tho v Duong
(74) *Attorney, Agent, or Firm*—Stein, McEwen & Bui, LLP

(57) ABSTRACT

Provided is a heatsink, including a cooling zone to contact an object to be frozen and having microchannels formed therein to define a plurality of fluid pathways, an inlet through which a working fluid enters, a distributor, interposed between the inlet and the cooling zone, to uniformly distribute the working fluid introduced through the inlet to the microchannels, an outlet through which the working fluid, passing through the cooling zone, exits, and a collector, interposed between the cooling zone and the outlet, to collect the working fluid passing through the microchannels.

20 Claims, 4 Drawing Sheets

HEATSINK

CROSS-REFERENCE TO RELATED PATENT APPLICATION

This application claims the benefit of Korean Patent Application No. 2005-91197, filed Sep. 29, 2005, in the Korean Intellectual Property Office, the disclosure of which is incorporated herein in its entirety by reference.

BACKGROUND OF THE INVENTION

1. Field of the Invention

Aspects of the present invention relate to a heatsink to cool an object to be frozen, and, more particularly, to a heatsink having microchannels that increase a contact area between the heatsink and a working fluid.

2. Description of the Related Art

In general, heatsinks are mounted on an object to be frozen such as a semiconductor chip to absorb and dissipate heat generated by the operation of the object to be frozen. Recently, however, attempts have been made to increase a contact area between a heatsink and a working fluid for the purpose of enhancing the efficiency of cooling an object to be frozen. In particular, U.S. Pat. No. 5,099,311 (hereinafter referred to as the '311 patent") discloses a microchannel heatsink assembly in which microchannels are processed on a heatsink to form a plurality of micro-sized fluid pathways (see FIG. 1).

The microchannel heatsink assembly of the '311 patent is illustrated in FIG. 1. As shown in FIG. 1, the heatsink assembly includes a manifold layer 10 through which a working fluid passes, and a microchannel layer 20 formed on the manifold layer 10 to cool the working fluid.

The manifold layer 10 includes an inlet 11 through which the working fluid enters, a fluid chamber 13 in which the working fluid having been cooled by the manifold layer 10 is contained, and an outlet 15 through which the working fluid inside the fluid chamber 13 exits the fluid chamber 13.

The microchannel layer 20 comprises microchannels 21 formed in a bottom surface thereof. The microchannels 21 form a plurality of fluid pathways between the inlet 11 and the fluid chamber 13 to increase a contact area between the working fluid and a front surface of the microchannel layer 20.

In the conventional heatsink assembly, the manifold layer 10 is attached onto the bottom surface of the microchannel layer 20 to uniformly supply the working fluid to the respective fluid pathways.

However, the conventional heatsink assembly has a drawback in that, since the manifold layer 10 and the microchannel layer 20 are directly bonded to each other in a two-layered structure, the overall thickness of the heatsink assembly increases. As such, using the conventional heatsink assembly in a thin electronic device is difficult.

SUMMARY OF THE INVENTION

An aspect of the present invention provides a heatsink that has thin thickness and uniformly distributes a working fluid to a plurality of fluid pathways.

According to an aspect of the present invention, there is provided a heatsink, including a cooling zone to contact an object to be frozen and having microchannels formed therein to define a plurality of fluid pathways, an inlet through which a working fluid enters, a distributor, interposed between the inlet and the cooling zone, to uniformly distribute the working fluid introduced through the inlet to the microchannels, an outlet through which the working fluid, passing through the cooling zone, exits, and a collector, interposed between the cooling zone and the outlet, to collect the working fluid passing through the microchannels.

The heatsink may further comprise a stabilizer which is interposed between the distributor and the cooling zone and/or between the cooling zone and the collector, and has the same width and height as the cooling zone to stabilize the flow of the distributed and/or collected working fluid.

Additional and/or other aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
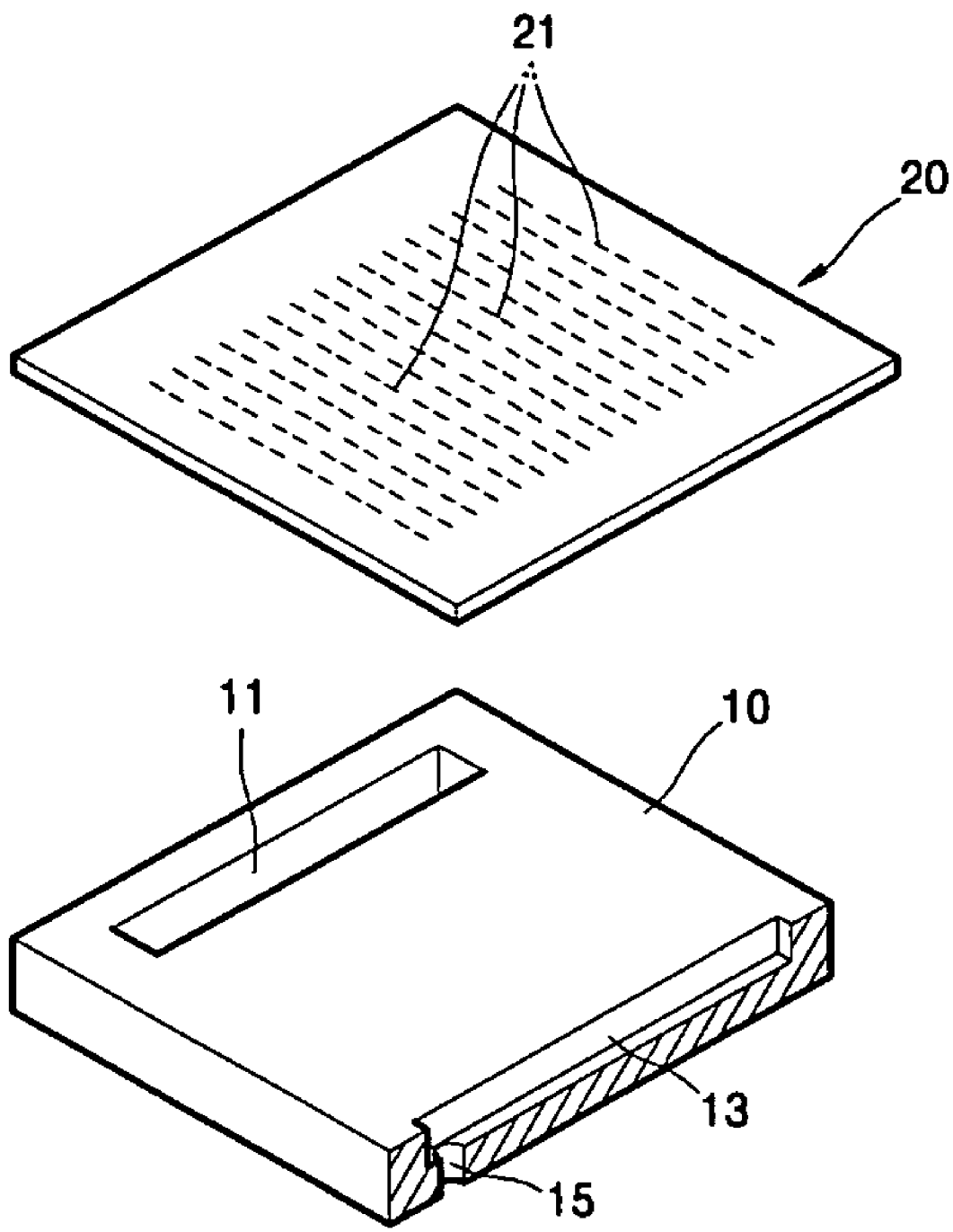
FIG. 1 is a partially cutaway exploded perspective view of a conventional heatsink.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
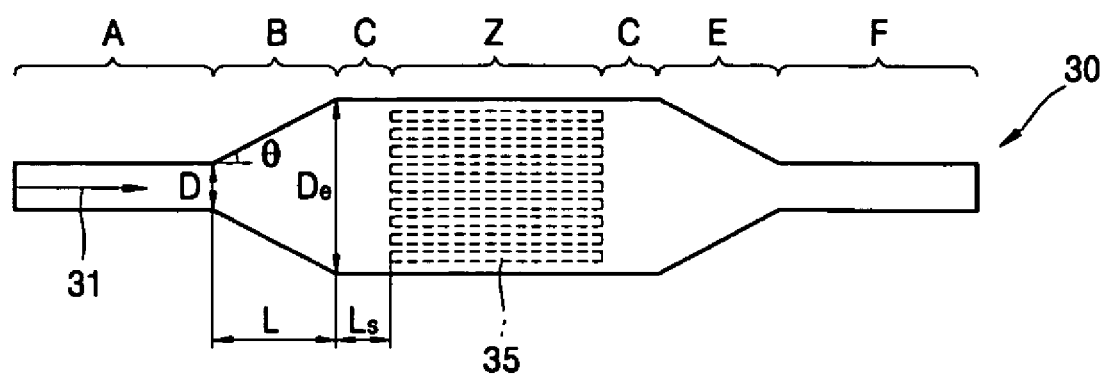
FIG. 2 is a plan view of a heatsink according to an embodiment of the present invention.
Figure 3:
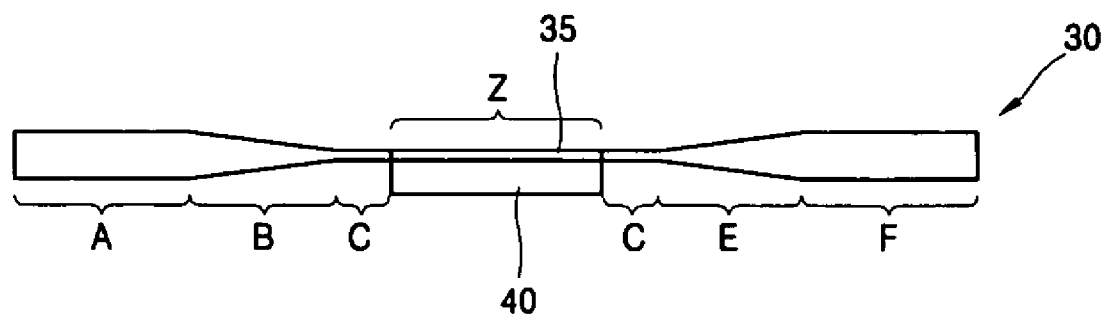
FIG. 3 is a side view of the heatsink of FIG. 2.

FIG. 2 is a plan view of a heatsink 30 according to an embodiment of the present invention. FIG. 3 is a side view of the heatsink of FIG. 2. As shown in FIGS. 2 and 3, the heatsink 30 is installed in a pipe or duct through which a working fluid enters the heatsink 30 from an external pump or tank. The heatsink 30 includes an inlet A through which the working fluid enters, a distributor B distributing the introduced working fluid, a cooling zone Z, a collector E collecting the working fluid that has passed through the cooling zone Z, and an outlet F through which the collected working fluid exits. According to an embodiment of the invention the inlet A, the distributor B, the cooling zone Z, the collector E, and the outlet F are sequentially arranged in a direction in which the working fluid flows through the heatsink 30.

According to an embodiment of the invention, the heatsink 30 is made of a highly heat conductive material. For example, the heatsink may be made of silicon, pure copper, brass, duralumin, or aluminum. The working fluid may be air, liquid nitrogen, water, fluorocarbon, or the like, each of which absorbs and transfers heat.

The cooling zone Z comprises a plurality of microchannels 35 to form a plurality of fluid pathways and contacts an object to be frozen 40. The object to be frozen 40 may be an integrated circuit generating a large amount of heat, such as a central processing unit (CPU) or a laser diode. The fluid pathways of the microchannels 35 are, in an embodiment of the invention, linear, but may be arranged in other formations. Accordingly, the fluid pathways also may have various shapes.

The distributor B is interposed between the inlet A and the cooling zone Z, and distributes the working fluid introduced through the inlet A to the microchannels 35.

According to an aspect of the invention, a width of the distributor B gradually increases from the end of the inlet A to the beginning of the cooling zone Z. Also, according to an aspect of the invention, a height of the distributor B gradually decreases from the end of the inlet A to the beginning of the cooling zone Z. In this case, the distributor B uniformly distributes the working fluid, and prevents fluid deceleration by provoking less of a pressure drop between the inlet A and the cooling zone Z.

According to an aspect of the invention, a width of the collector E gradually decreases from the end of the cooling zone Z to the beginning of the outlet F. Also, according to an aspect of the invention, a height of the collector E gradually increases from the end of the cooling zone Z to the beginning of the outlet F. The collector E and the distributor B are symmetric with respect to a central vertical axis of the heatsink 30. Accordingly, the working fluid, passing through the cooling zone Z, is uniformly re-collected, such that the working fluid exits through the outlet F without a substantial change in a pressure distribution of the fluid.

The heatsink 30 may further include a stabilizer C interposed between the distributor B and the cooling zone Z and/or between the cooling zone Z and the collector E. The stabilizer C has the same inner width and height as the cooling zone Z so as to provide for a stabilization of the flow of the distributed and/or collected working fluid.

The length of distributor B may be given by the relationship, $$L = \frac{D_e - D}{2 \cdot \tan\theta} \quad (1)$$

where L denotes the length of the distributor B, $D_e$ denotes the maximum width of the distributor B, D denotes the maximum width of the distributor B, and $\theta$ denotes the inclination angle of the distributor B.

Figure 4A:
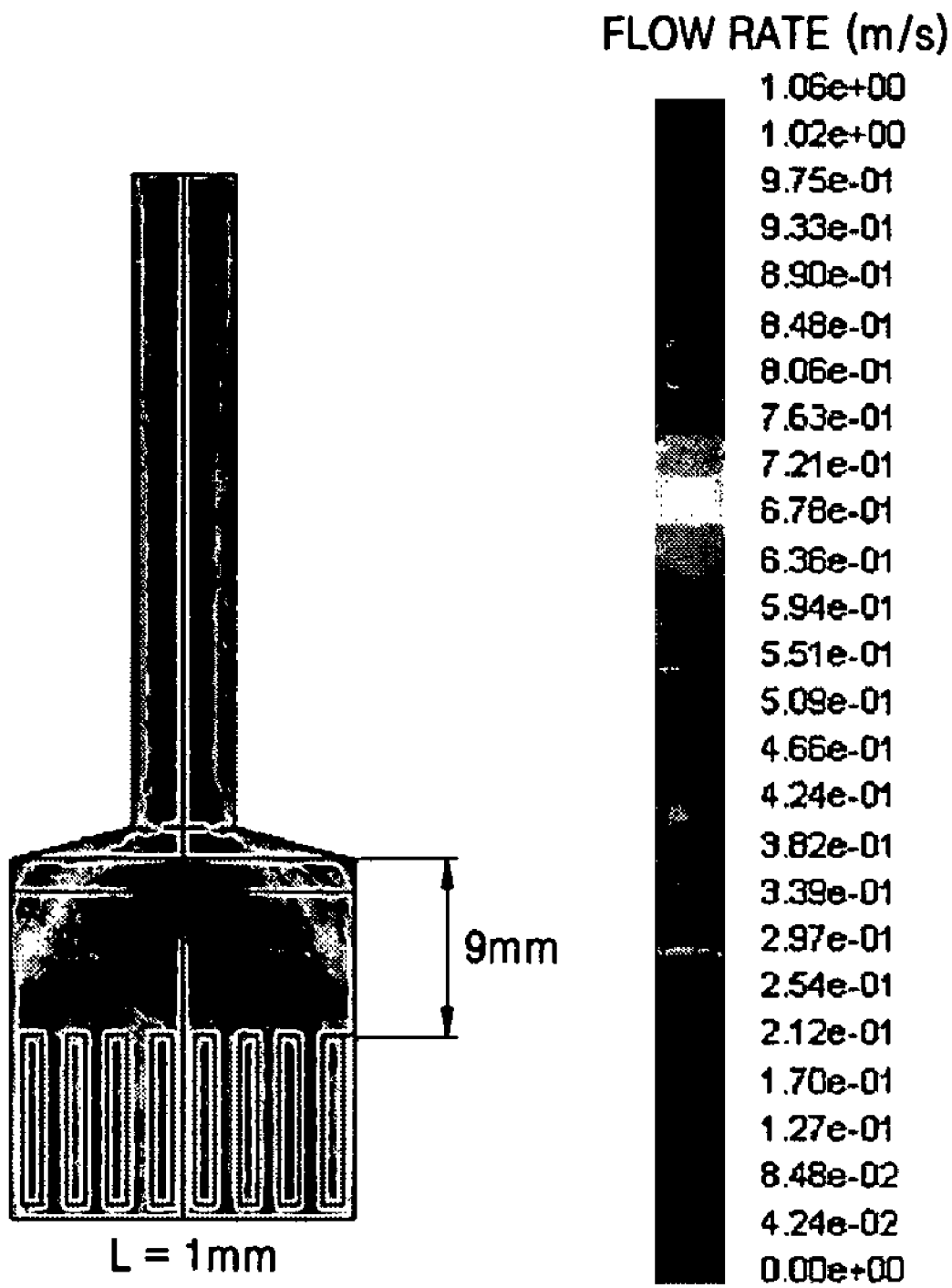
FIG. 4A illustrates a flow rate change when a distributor has a length of 1 mm and a stabilizer has a length of 9 mm in the heatsink of FIG. 2.

According to an aspect of the invention, the inclination angle $\theta$ ranges from 0° to 50°. If the angle of inclination $\theta$ exceeds the upper limit of 50°, as shown in FIG. 4A, the flow rate of the working fluid in a central portion of the microchannels 35 has been found to be greater than the flow rate of the working fluid in other portions of the microchannels 35, thereby failing to achieve uniform distribution of the working fluid.

The length of the stabilizer C may be given by the relationship, $$L_s = D_e - L \quad (2)$$

where Ls denotes the length of the stabilizer C and where the terms De and L are the same as indicated above.

Figure 4B:
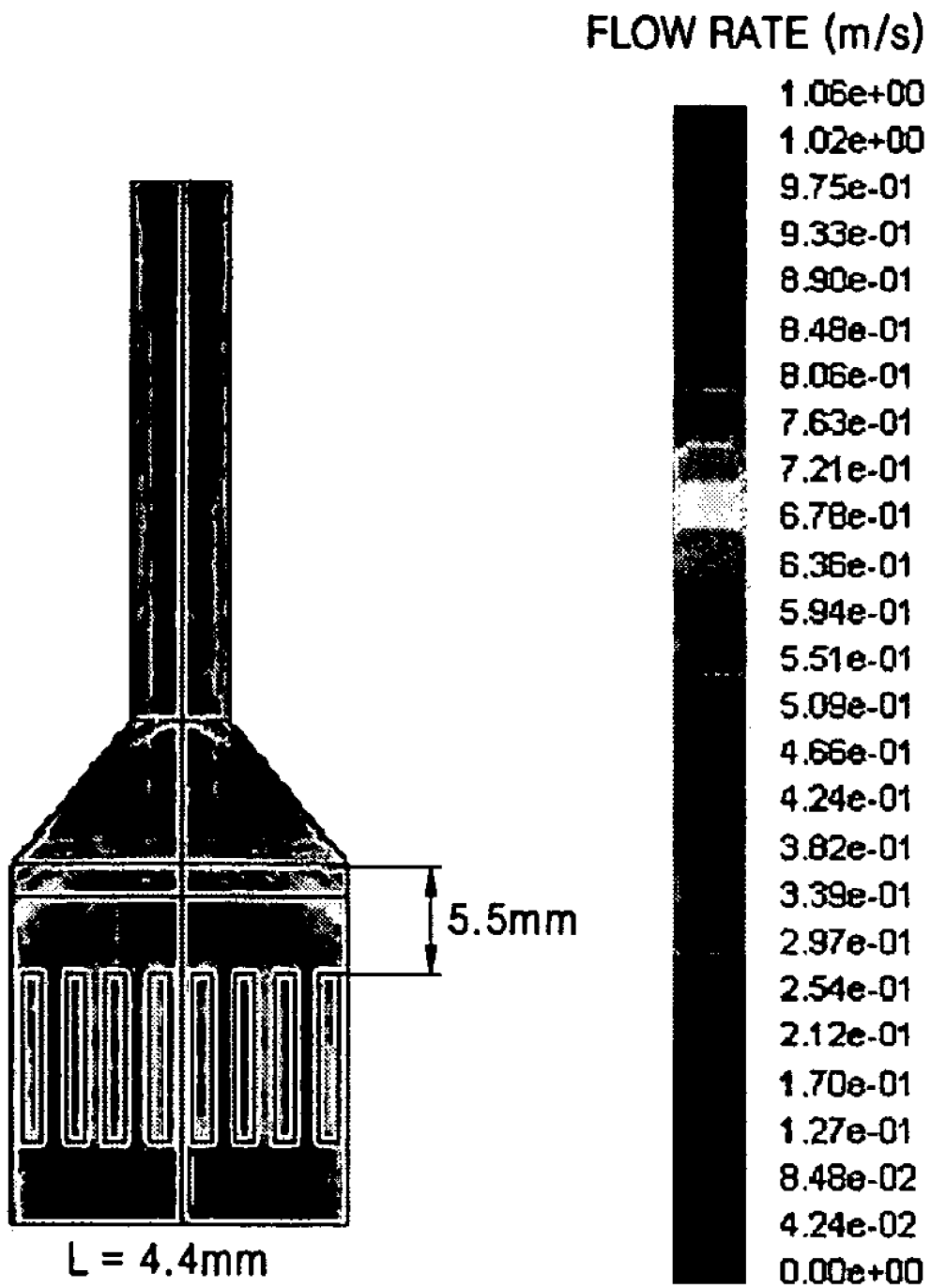
FIG. 4B illustrates a flow rate change when the distributor has a length of 4.4 mm and the stabilizer has a length of 5.5 mm in the heatsink of FIG. 2.

When $D_e$=10 mm, D=3 mm, and L=4.4 mm, and $\theta$ is equal to 38.5°, the working fluid may be uniformly distributed to all the microchannels 35 as shown in FIG. 4B.

As is described above, according to aspects of the invention, since the heatsink including the inlet A, the distributor B, the cooling zone Z, the collector E, and the outlet F is installed in a single pipe or duct, the overall thickness of the heatsink may be minimized. Therefore, since the working fluid is uniformly distributed to the respective fluid pathways of the microchannels 35 by optimizing the shapes of the distributor B and the collector E, cooling efficiency is enhanced.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A heatsink, comprising:
   a cooling zone to contact an object to be frozen and having microchannels formed therein to define a plurality of fluid pathways;
   an inlet through which a working fluid enters;
   a distributor, interposed between the inlet and the cooling zone, to uniformly distribute the working fluid introduced through the inlet to the microchannels;
   an outlet through which the working fluid, passing through the cooling zone, exits; and
   a collector, interposed between the cooling zone and the outlet, to collect the working fluid passing through the microchannels;
   wherein a width of the distributor gradually increases from an end of the inlet to a beginning of the cooling zone, and a width of the collector gradually decreases from an end of the cooling zone to a beginning of the outlet, and
   wherein a length of the distributor is given by the relationship, $$L = \frac{D_e - D}{2 \cdot \tan\theta}$$

where L denotes the length of the distributor, $D_e$ denotes a maximum width of the distributor, D denotes a minimum width of the distributor, and $\theta$ denotes an inclination angle of the distributor relative to longitudinal lengths of the inlet and the outlet.

2. The heatsink according to claim 1, wherein a height of the distributor gradually decreases from an end of the inlet to a beginning of the cooling zone.

3. The heatsink according to claim 1, wherein the inclination angle $\theta$ ranges from 0° to 50°.

4. The heatsink according to claim 1, wherein a height of the collector gradually increases from an end of the cooling zone to a beginning of the outlet.

5. The heatsink according to claim 4, wherein both the collector and the distributor are each symmetric with respect to a central vertical axis of the heatsink.

6. The heatsink according to claim 4, further comprising a first stabilizer, interposed between the distributor and the cooling zone, to stabilize the flow of the distributed working fluid.

7. The heatsink according to claim 6, wherein a width and a height of the first stabilizer are each substantially similar to a width and a height of the cooling zone.

8. The heatsink according to claim 7, further comprising a second stabilizer, interposed between the cooling zone and the collector, to stabilize the flow of the collected working fluid.

9. The heatsink according to claim 8, wherein a width and a height of the second stabilizer are each substantially similar to the width and the height of the cooling zone.

10. The heatsink according to claim 1, further comprising a first stabilizer, interposed between the distributor and the cooling zone, to stabilize the flow of the distributed working fluid.

11. The heatsink according to claim 10, wherein a width and a height of the first stabilizer are substantially similar to a width and a height of the cooling zone.

12. The heatsink according to claim 11, further comprising a second stabilizer, interposed between the cooling zone and the collector, to stabilize the flow of the collected working fluid.

13. The heatsink according to claim 12, wherein a width and a height of the second stabilizer are substantially similar to the width and the height of the cooling zone.

14. A heatsink to cool a surface of an object to be frozen, comprising:
   a cooling zone to contact the object to be frozen, the cooling zone having a plurality of fluid pathways formed therein to substantially cover the object to be frozen;
   a distributor to distribute a fluid to the microchannels with a uniform pressure distribution to remove heat from the surface of the object to be frozen; and
   a collector to collect the fluid having passed through the microchannels without a substantial change in the pressure distribution thereof; and
   wherein a width of the distributor gradually increases from an end of the inlet to a beginning of the cooling zone, and a width of the collector gradually decreases from an end of the cooling zone to a beginning of the outlet, and
   wherein a length of the distributor is given by the relationship, $$L = \frac{D_e - D}{2 \cdot \tan\theta}$$

where L denotes the length of the distributor, $D_e$ denotes a maximum width of the distributor, D denotes a minimum width of the distributor, and $\theta$ denotes an inclination angle of the distributor relative to longitudinal lengths of the inlet and the outlet.

15. The heatsink according to claim 14, further comprising a first stabilizer, interposed between the distributor and the cooling zone, to stabilize the flow of the distributed fluid.

16. The heatsink according to claim 15, wherein a width and a height of the first stabilizer are each substantially similar to a width and a height of the cooling zone.

17. The heatsink according to claim 16, further comprising a second stabilizer, interposed between the cooling zone and the collector, to stabilize the flow of the collected fluid.

18. The heatsink according to claim 17, wherein a width and a height of the second stabilizer are each substantially similar to the width and the height of the cooling zone.

19. The heatsink according to claim 11, wherein a length of the first stabilizer is given by the relationship, $$L_s = D_e - L$$

where Ls denotes the length of the first stabilizer.

20. The heatsink according to claim 16 wherein a length of the first stabilizer is given by the relationship, $$L_s = D_e - L$$

where Ls denotes the length of the first stabilizer.

* * * * *

UNITED STATES PATENT AND TRADEMARK OFFICE
CERTIFICATE OF CORRECTION

| | | |
|---|---|---|
| PATENT NO. | : 7,441,591 B2 | Page 1 of 1 |
| APPLICATION NO. | : 11/520012 | |
| DATED | : October 28, 2008 | |
| INVENTOR(S) | : Hee-sung Park et al. | |

It is certified that error appears in the above-identified patent and that said Letters Patent is hereby corrected as shown below:

Column 5, line 20, delete "the".

Column 5, line 20, insert --in the cooling zone-- after "microchannels".

Signed and Sealed this

Twenty-third Day of December, 2008

JON W. DUDAS
*Director of the United States Patent and Trademark Office*